United States Patent [19]

Bae

[11] Patent Number: 5,468,577
[45] Date of Patent: Nov. 21, 1995

[54] PHOTOMASK HAVING PATTERNS TO REDUCE POWER OF A STEPPER

[75] Inventor: Sang M. Bae, Bubaleub, Rep. of Korea

[73] Assignee: Hyundai Electronics Industries Co., Ltd., Rep. of Korea

[21] Appl. No.: 258,193

[22] Filed: Jun. 10, 1994

[30] Foreign Application Priority Data

Jun. 12, 1993 [KR] Rep. of Korea ............... 1993-10716

[51] Int. Cl.⁶ .................................................... G03F 9/00
[52] U.S. Cl. ............................ 430/5; 430/322; 430/324; 430/329
[58] Field of Search ............................. 430/5, 322, 324, 430/329

[56] References Cited

U.S. PATENT DOCUMENTS 5,229,230 7/1993 Kamon ........................................ 430/5

Primary Examiner—S. Rosasco
Attorney, Agent, or Firm—Merchant, Gould, Smith, Edell, Welter & Schmidt

[57] ABSTRACT

An energy-saving photomask comprises: at least one first pattern region in which a light can penetrate through the photomask without diffraction; and a second pattern region in which a plurality of fine patterns are formed in such a way to serve as slits through which the light is diffracted to increase the energy of the light irradiated relative to the first pattern region and diffracted to an extent that it comes to have an insufficient energy for the development of all photosensitive film except below the first pattern region. By virtue of the auxiliary patterns, the energy of the light incident on the photosensitive film can be rich at the auxiliary patterns contributes intensity of light to the desired portions without seriously affecting other portions. Because of a reduction of processing time, the photomask prolongs the lifetime of a light lamp in the stepper, as well as allows usage of a stepper with low power.

4 Claims, 3 Drawing Sheets

PHOTOMASK HAVING PATTERNS TO REDUCE POWER OF A STEPPER

BACKGROUND OF THE INVENTION

1. Field of the invention

The present invention relates, in general, to a photomask useful to the exposure of a photosensitive film of a semiconductor device to a light and, more particularly, to a photomask capable of accomplishing the exposure with a small amount of energy, thereby saving the energy.

2. Description of the Prior Art

Generally, in order to form a predetermined pattern, a series of processes must be carried out, that is, coating a photosensitive film on a wafer, exposing it to a light along with a photomask and developing it. When a contact hole is to be formed, a greater energy of irradiating light is required than when other patterns are to be formed.

In order to better understand the background of the present invention, description for a conventional photomask will be given next with reference to some figures.

First, referring to FIG. 1, there is a plan view showing a photomask according to a conventional technique. In this photomask, a region for the exposure of photosensitive film to a light by which a contact hole will be formed is made of a non-chrome material 3, and the other regions are formed of a chrome layer 2.

Referring to FIG. 2, there is shown a result of the exposure to a light using the conventional photomask of FIG. 1. As shown in these figures, on being irradiated on the conventional photomask in a stepper, a light is blocked in the regions of chrome layer 2 atop a quartz substrate 4, whereas it penetrates through the quartz substrate below the non-chrome region and reaches predetermined portions of a photosensitive film 7 placed on a wafer 9. The irradiated, predetermined portions of the photosensitive film 7 are eliminated in a subsequent developing process.

FIG. 3 shows the intensity of the light irradiated over the photosensitive film, indicating that the non-chrome region has higher intensities than the other regions.

As will be expected, the exposure to a light using the conventional photomask is problematic in that if the chrome layer occupies a greater part of the photomask, like a contact hole mask, a greater energy for the exposure is required. In addition, in case of using a stepper with a low power, a high degree of resolution is difficult to obtain with the conventional photomask.

SUMMARY OF THE INVENTION

Therefore, an object is to overcome the aforementioned problems encountered in the prior art and to provide an energy-saving photomask designed to diffract an incident light at a plurality of auxiliary patterns, thereby forming a desired pattern on a wafer with less energy and hence saving the energy.

In accordance with the present invention, the above object can be accomplished by a provision of an energy-saving photomask, comprising: at least one of first pattern region in which a light can penetrate through the photomask without diffraction; and a second pattern region in which a plurality of fine patterns are formed in such a way to serve as slits through which the light is diffracted to increase the energy of the light irradiated to the first pattern region and diffracted to an extent that it comes to have an insufficient energy to the development of all photosensitive film except below the first pattern region.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE INVENTION

Hereinafter, the preferred embodiment of the present invention will be in detail described with reference to the accompanying drawings.

To begin with, the technical principle of the present invention is introduced. A light with a constant wavelength shows various degrees of diffraction in dependence with a size of a slit. An auxiliary pattern which is greater than the wavelength of the light used in a stepper and capable of controlling the degree of the diffraction of the light can be utilized to form a pattern on a wafer. That Is, the images of the auxiliary pattern is not transferred to the wafer because of the large degree of diffraction. In addition, the intensity of the diffractive light is added to the intensity of the image resulting from a mask pattern, so that a predetermined pattern can be accurately formed on the wafer with less irradiation energy.

Figure 1:
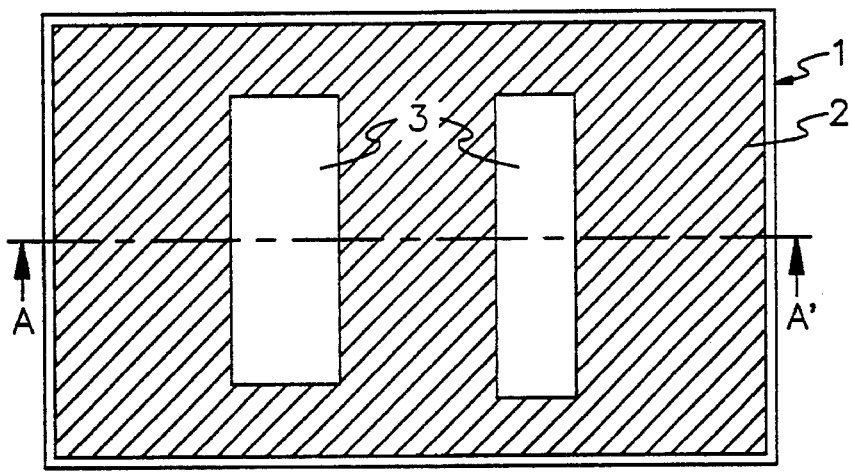
FIG. 1 is a schematic, plan view showing a conventional mask.
Figure 2:
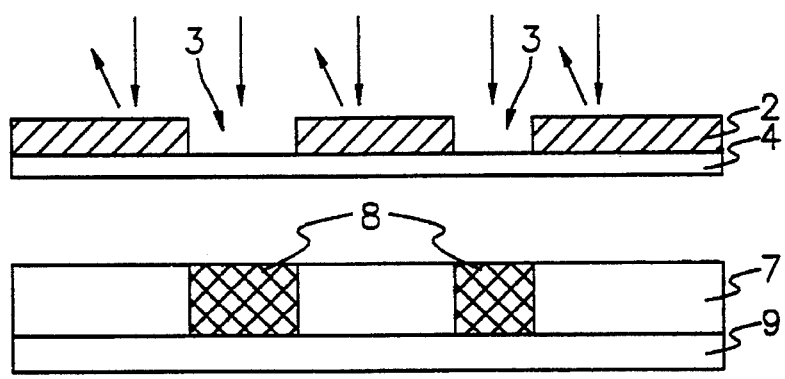
FIG. 2 are schematic, cross sectional views illustrating the procedure of an exposure of photosensitive film to a light using the conventional photomask, taken generally through section line A—A' of FIG. 1.
Figure 3:
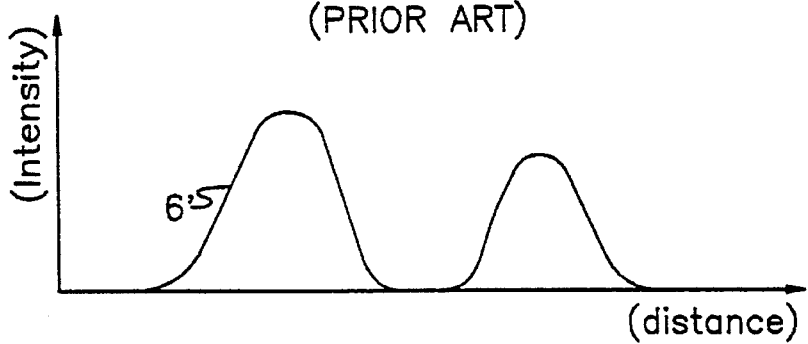
FIG. 3 shows a distribution of energy in the light irradiated to the photomask of FIG. 1.
Figure 4:
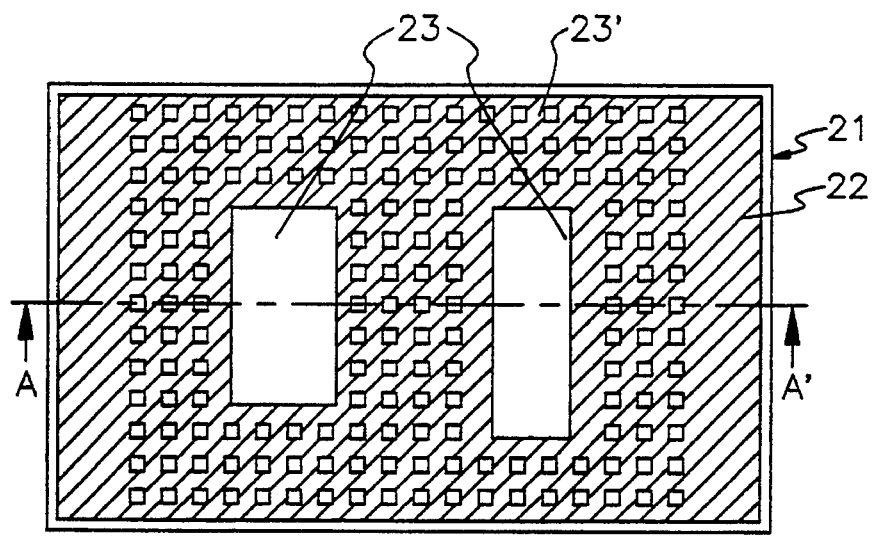
FIG. 4 is a schematic, plan view showing a photomask with auxiliary patterns, according to the present invention.

A photomask to accomplish the principle of the present invention is shown in FIG. 4. As shown in this figure, besides main non-chrome regions 23, a plurality of fine auxiliary patterns 23' are formed of a non-chrome material in such a way to play a role as slits for the light irradiated over a chrome layer 22. The fine auxiliary pattern 23' is so sized as to have a shortest length therein longer than the wavelength of an irradiating source and a longest length shorter than three times of the wavelength.

Figure 5:
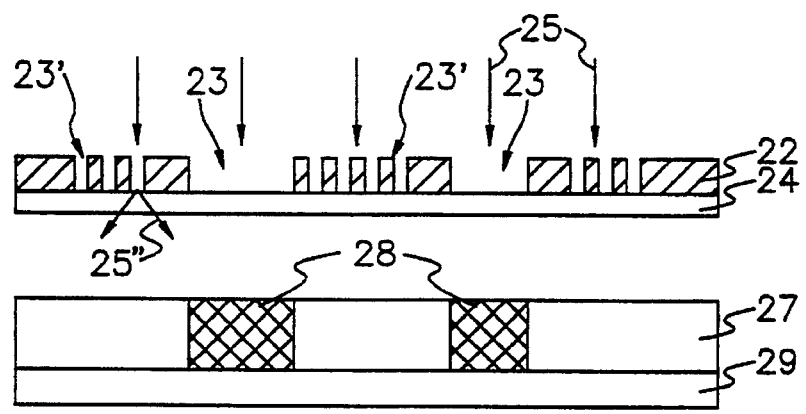
FIG. 5 are schematic, cross sectional views illustrating the procedure of an exposure of photosensitive film to a light using a photomask according to the present invention, taken generally through section line A—A' of FIG. 4.

Referring now to FIG. 5, there is shown the procedure of lithography using the photomask of the present invention. As shown in these figures, a light irradiated over the photomask reaches a photosensitive film 27 (in this case, positive photosensitive film) atop a wafer 29 through a quartz substrate 24 straightly or in diffraction.

The light incident over the photosensitive film formed on the wafer 29 is largely grouped into two: one comes from through the main non-chrome regions 23 which has great influence on the formation of a pattern of photosensitive film; the other comes from the diffraction by the slits, the auxiliary patterns, which distributes the light over wide ranges. In the meanwhile, the photosensitive film is exposed to a weak light, the diffracted light, at some predetermined portions 27 and to a more strong light, the sum of the vertically incident light through the non-chrome region and the diffracted light, at other predetermined portions 28 (positive photosensitive film).

Figure 6:
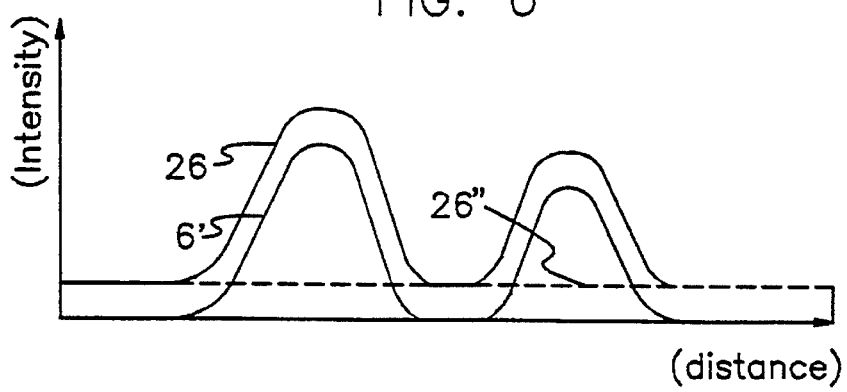
FIG. 6 shows a distribution of energy in the light irradiated to the photomask of FIG. 4.

Accordingly, as shown in FIG. 6, the distribution of energy 26 in the light incident on the photosensitive film results from the sum of the distribution of energy 6', formed in the absence of the auxiliary patterns 23', and the distribution of energy 26" due to the auxiliary patterns 23' which is constant over all of the photosensitive film. Consequently, the more strengthened light is irradiated to the predetermined portions 28 of the photosensitive film, so that the pattern of the photosensitive film can be formed with less energy. In this connection, a mask manufacturer may control the distribution of energy in the incident light through the density and the proper arrangement of the auxiliary patterns 23'.

Figure 7:
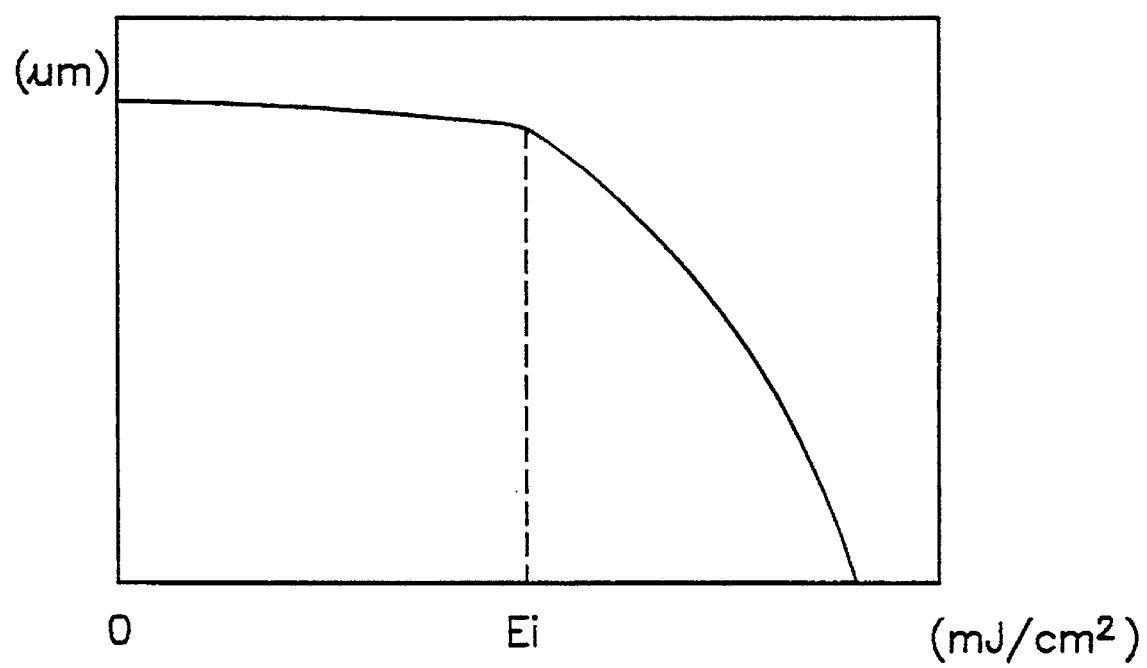
FIG. 7 is a graph showing the thickness of the photosensitive film left after development with regard to an energy amount of the light irradiated to the photomask of the present invention.

Referring to FIG. 7, there is plotted the thickness of the photosensitive film left after the development with regard to the energy of the light. Developing the exposed photosensitive film leaves only the predetermined regions 22 eliminating the positive photosensitive film 28. For a certain amount (Ei) of energy necessary to remove the photosensitive film cannot be obtained with the diffracted light by the auxiliary pattern 23'.

As described hereinbefore, a high energy distribution of an irradiating light over a predetermined portion can be obtained only by an appropriate rearrangement of the auxiliary patterns without increasing the intensity of light source, in accordance with the present invention. Therefore, the present invention can effect the reduction of processing time and prolong of the life time of a light lamp in the stepper as well as the utilization of the stepper with a low power.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A photomask comprising:

at least one first pattern region through which light can penetrate without diffraction to a desired location of a photosensitive film suitable for development; and a second pattern region including a plurality of fine patterns formed to serve as openings for diffracting the light to provide increased light energy reaching the desired location beyond only irradiation as a result of the first pattern region, whereby the light energy from diffracting light is insufficient for development of the photosensitive film outside of the desired location.

2. The photomask of claim 1, wherein the fine patterns have a shortest distance therein longer than the wavelength of the light, and a longest distance shorter than three times of the wavelength.

3. The photomask of claim 1, wherein the first pattern region is formed in a size sufficient to determine the size of a contact hole.

4. The photomask of claim 1, wherein the first pattern region and the second pattern region each is formed either in a relief or in an intaglio which is independently coated with chrome or not.

\* \* \* \* \*